(12) United States Patent
Rinzler et al.

(10) Patent No.: US 8,952,361 B2
(45) Date of Patent: Feb. 10, 2015

(54) SEMICONDUCTOR DEVICES INCLUDING AN ELECTRICALLY PERCOLATING SOURCE LAYER AND METHODS OF FABRICATING THE SAME

(75) Inventors: Andrew Gabriel Rinzler, Gainesville, FL (US); Bo Liu, Gainesville, FL (US); Mitchell Austin McCarthy, Gainesville, FL (US)

(73) Assignee: University of Florida Research Foundation, Inc., Gainesville, FL (US)

( * ) Notice: Subject to any disclaimer, the term of this patent is extended or adjusted under 35 U.S.C. 154(b) by 300 days.

(21) Appl. No.: 13/580,199

(22) PCT Filed: Mar. 4, 2011

(86) PCT No.: PCT/US2011/027155
§ 371 (c)(1),
(2), (4) Date: Aug. 21, 2012

(87) PCT Pub. No.: WO2011/109693
PCT Pub. Date: Sep. 9, 2011

(65) Prior Publication Data
US 2012/0319096 A1    Dec. 20, 2012

Related U.S. Application Data

(60) Provisional application No. 61/310,342, filed on Mar. 4, 2010.

(51) Int. Cl.
*H01L 35/24*    (2006.01)
*H01L 51/05*    (2006.01)
(Continued)

(52) U.S. Cl.
CPC ............. *H01L 51/0545* (2013.01); *B82Y 10/00* (2013.01); *H01L 51/0541* (2013.01); *H01L 51/0591* (2013.01); *H01L 51/0566* (2013.01);
(Continued)

(58) Field of Classification Search
USPC .............................................. 257/40, E51.001
See application file for complete search history.

(56) References Cited

U.S. PATENT DOCUMENTS

| 2004/0113152 A1 | 6/2004 | Kim et al. |
| 2005/0121674 A1 | 6/2005 | Kamata et al. |
| 2009/0302310 A1 | 12/2009 | Rinzler et al. |

FOREIGN PATENT DOCUMENTS

| CA | 2702851 A1 | 3/2009 |
| WO | WO 2009/036071 A2 | 3/2009 |

OTHER PUBLICATIONS

The International Search Report and Written Opinion dated Oct. 27, 2011.
(Continued)

*Primary Examiner* — Anthony Ho
(74) *Attorney, Agent, or Firm* — Wolf, Greenfield & Sacks, P.C.

(57) ABSTRACT

Various embodiments are provided for semiconductor devices including an electrically percolating source layer and methods of fabricating the same. In one embodiment, a semiconductor device includes a gate layer, a dielectric layer, a memory layer, a source layer, a semiconducting channel layer, and a drain layer. The source layer is electrically percolating and perforated. The semiconducting channel layer is in contact with the source layer and the memory layer. The source layer and the semiconducting channel layer form a gate voltage tunable charge injection barrier.

80 Claims, 6 Drawing Sheets

(51) Int. Cl.
    B82Y 10/00    (2011.01)
    H01L 51/00    (2006.01)
(52) U.S. Cl.
    CPC .......... H01L 51/057 (2013.01); *H01L 51/0048* (2013.01)
    USPC .................................. 257/40; 257/E51.001

(56) References Cited

OTHER PUBLICATIONS

Liu, et al., "Carbone-Nanotube-Enabled Vertical Field Effect and Light-Emitting Transistors," Advanced Materials, vol. 20, pp. 3605-3609, Aug. 27, 2008.
Aguirre, et al.,"Carbon Nanotubes as Injection Electrodes for Organic Thin Film Transistors," Nano Letters, 2009, vol. 9, No. 4, pp. 1547-1461.
Park, et al., "Recent Development in Polymer Ferroelectric Field Effect Transistor Memory," Journal of Semiconductor Technology and Science, vol. 8, No. 1, Mar. 2008, pp. 51-65.
Baeg, et al., "Organic Non-Volatile Memory Based on Pentacene Field-Effect Transistors Using a Polymeric Gate Electret," Advanced Materials 2006, 18, 3179-3183.
Katz, et al., "Organic Field-Effect Transistors with Polarizable Gate Insulators," Journal of Applied Physics, vol. 91, No. 3, Feb. 1, 2002, 99. 1572-1576.
Velu, et al., "Low Driving Voltages and Memory Effect in Organic Thin-Film Transistors with a Ferroelectric Gate Insulator," Applied Physics Letters, vol. 79, No. 5, Jul. 30, 2001, pp. 659-661.
Schroeder, et al., "All-Organic Permanent Memory Transistor Using an Amorphous, Spin-Cast Ferroelectric-like Gate Insulator," Advanced Materials 2004, 16, No. 7, Apr. 5, 2004, pp. 633-636.
Wu, et al., "High-Performance Organic Transistor Memory Elements with Steep Flanks of Hysteresis," Advanced Functional Materials, 2008, 18, pp. 2593-2601.
The Examination Report in the related Australian Patent Application No. 2011222601 dated Jul. 30, 2013.
Supplementary European Search Report and Examination Report for EP 11 75 1409 mailed Apr. 11, 2014.

SEMICONDUCTOR DEVICES INCLUDING AN ELECTRICALLY PERCOLATING SOURCE LAYER AND METHODS OF FABRICATING THE SAME

CROSS REFERENCE TO RELATED APPLICATIONS

This application is a National Stage under 35 U.S.C. §371 of PCT international application PCT/US2011/027155 entitled "SEMICONDUCTOR DEVICES INCLUDING AN ELECTRICALLY PERCOLATING SOURCE LAYER AND METHODS OF FABRICATING THE SAME" filed Mar. 4, 2011, which claims priority under 35 U.S.C. §119(e) to U.S. Provisional Application Ser. No. 61/310,342, entitled "SEMICONDUCTOR DEVICES INCLUDING A NANOTUBE LAYER AND A MEMORY LAYER AND METHODS OF FABRICATING THE SAME" filed on Mar. 4, 2010, each of which is herein incorporated by reference in its entirety.

STATEMENT REGARDING FEDERALLY SPONSORED RESEARCH OR DEVELOPMENT

This invention was made with government support under agreement ECC0824157 awarded by the National Science Foundation. The Government has certain rights in the invention.

BACKGROUND

Organic field-effect transistors (OFETs) are field effect transistors that use an organic material as their semiconductor channel. These organic molecule based transistors can be fabricated using lower cost capital equipment and lower temperatures compared to traditional silicon based transistors, thereby offering an opportunity to offer inexpensive devices for many commercial applications.

BRIEF DESCRIPTION OF THE DRAWINGS

Many aspects of the present disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

DETAILED DESCRIPTION

Disclosed herein are various embodiments related to semiconductor devices including an electrically percolating source layer and methods of fabricating the same. Reference will now be made in detail to the description of the embodiments as illustrated in the drawings, wherein like reference numbers indicate like parts throughout the several views.

Figure 1:
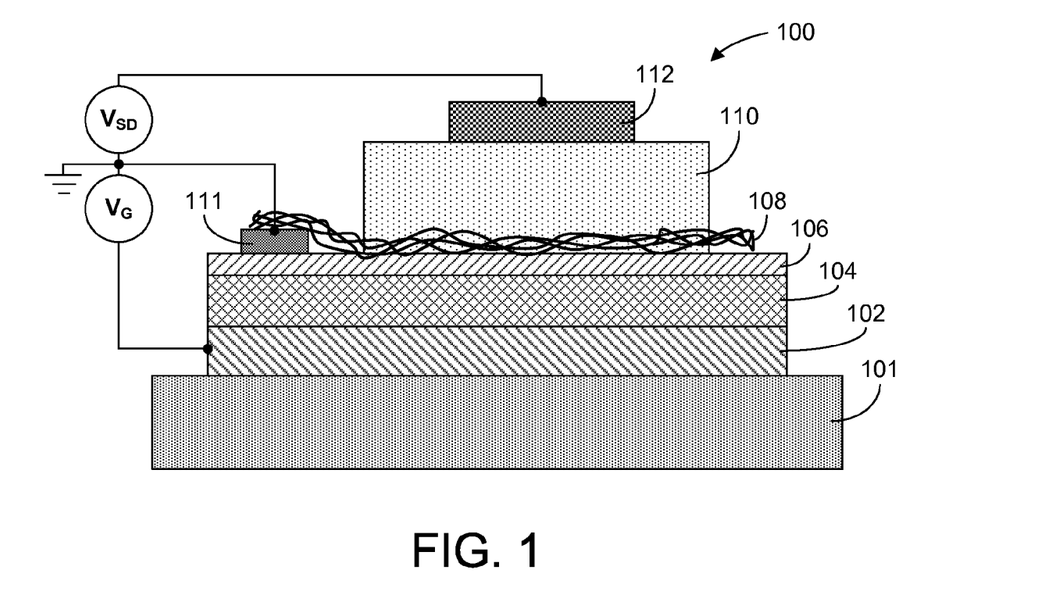
FIGS. 1-4 are cross-sectional views of examples of semiconductor devices including an electrically percolating source layer in accordance with various embodiments of the present disclosure.

Referring to FIG. 1, shown is a cross-sectional, two-dimensional diagram (with thickness not to scale) of a nonlimiting embodiment of a semiconductor device 100. The semiconductor device 100 operates as a memory element having enhanced hysteresis characteristics or a transistor having mitigated hysteresis characteristics, which will be discussed in further detail below. The semiconductor device 100 comprises the following layers: an insulating substrate 101, a gate layer 102, a dielectric layer 104, a memory layer 106, contact pad 111, a source layer 108, a semiconducting channel layer 110, and a drain layer 112. The source layer 108 is an electrically percolating layer such as, e.g., a dilute network of carbon nanotubes (CNTs), a layer of graphene, a dilute network of metallic and/or semiconducting nanowires, or a layer of a conductor, semiconductor, or semi-metal including perforations. While the embodiment of FIG. 1 is described as including a network of carbon nanotubes as the source layer 108 (i.e., a nanotube source layer 108), the other types of source layers 108 are also applicable as can be appreciated. The semiconductor device 100 is configured to utilize a field effect controlled Schottky barrier at the interface between the source layer 108 and the semiconducting channel layer 110 in order to turn the device on and off, taking advantage of the low density of states of the carbon nanotubes (or other source layer material) and their nanoscale diameters in the nanotube source layer 108. The memory layer 106 does not rely on charge injection from mobile carriers induced in the channel of the semiconducting channel layer 110. Instead, the architecture of the semiconductor device 100 enables charge injection into the memory layer 106 directly from the source layer 108 and not from the semiconducting channel layer 110 like other memory devices, resulting in lower write and erase voltages while preserving low reading voltages and fast reading speeds. The memory layer 106 may include a charge storage material or a ferroelectric material. Each of the layers, the configuration, and operation of the semiconductor device 100 will be discussed in further detail in the following paragraphs.

The insulating substrate 101 may include an insulating material such as, but not limited to, glass or plastic that insulates the gate layer 102, which is formed on the insulating substrate 101. In some implementations, the insulating substrate 101 includes a conductive substrate (e.g., a stainless steel substrate) that includes an insulating surface layer between the conductive substrate and the gate layer 102. The insulating surface layer may be pre-deposited on the conductive substrate surface.

The gate layer 102 functions as a gate electrode and includes an electrically conducting or semiconducting material. The material of the gate layer 102 may be an inorganic material or organic material. Inorganic materials include, but are not limited to, metals, semiconductors, and transparent conducting oxides. For example, in some embodiments, the gate layer 102 includes at least one kind of semiconductor such as silicon (e.g., a degeneratively-doped p-type or n-type Si substrate). In other embodiments, the gate layer 102 may include a metal such as Al, Au, Ag, Pd, Pt, Ta, W, Cu, Zn, Mg, Cd, Sb, Ti, Sn, Sr, Bi, and/or one or more of a variety of other metals as well as mixtures thereof. In alternative embodiments, the gate layer 102 may include a transparent conducting oxide such as tin oxide, indium oxide, tin-doped indium oxide (ITO), zinc oxide, cadmium oxide, magnesium-doped indium oxide, gallium-doped indium oxide, $CdSb_2O_6$, and/or mixtures thereof. The transparent conducting oxide or mixtures thereof may be doped with any of the metals from the group of: Al, Au, Ag, Pd, Pt, Ta, W, Cu, Zn, Mg, Cd, Sb, Ti, Sn, Sr, and Bi, and/or one or more of a variety of other metals or mixtures thereof. Organic materials include, e.g., highly conductive polymer mixtures such as Poly(3,4-ethylenedioxythiophene)poly(styrenesulfonate) (PEDOT:PSS).

The dielectric layer 104, which is formed on the gate layer 102, includes an inorganic dielectric material such as: silicon oxide, silicon nitride, silicon oxynitride ($SiO_xN_y$), aluminum oxide, hafnium oxide, tantalum oxide, titanium oxide, lanthanum oxide, zirconium oxide, yttrium oxide, aluminum-titanium oxide, mixtures thereof, and/or one or more of a variety of organic insulating materials including, but not limited to, spin-on polymeric dielectrics such as, e.g., polyimide, polyamide, benzocyclobutene (BCB), polyethylene, or other mixtures. In some embodiments, the dielectric layer 104 includes multiple layers of dielectric materials.

On the dielectric layer 104 is formed a memory layer 106. In some embodiments, the memory layer 106 includes a charge storage material that is both capable of storing charge and impervious to solvents so that the charge storage material will not dissolve during subsequent solution based processing steps during fabrication of the semiconductor device 100. However, in some embodiments, the charge storage material of the memory layer 106 may not be impervious to solvents where the techniques used to transfer a dilute nanotube mesh does not involve a solvent (such as, e.g., PDMS stamps) and/or the semiconducting channel layer 110 is evaporated onto the source electrode 108, so that the memory layer 106 is not exposed to a solvent. Depending on the embodiment, the memory layer 106 has a thickness ranging from less than 1 nm to about 100 µm.

The memory layer 106 may include a single material or may include multiple layers or a blend of different materials, such as a donor molecule blend or a nanoparticle-embedded dielectric layer. In some embodiments, the memory layer 106 is a charge storage material including benzocyclobutene (BCB), which is a cross-linking, spin-on, low dielectric constant polymer. BCB may act as an electret having a charge storage ability as well as a relatively high stability. In those embodiments, the BCB may be spun onto the dielectric layer 104 (such as, e.g., a $SiO_2$ layer) and annealed to form the memory layer 106. In other embodiments, the memory layer 106 includes a charge storage material including one or more of the following: Cytop™, polystyrene (PS), poly(4-methyl styrene) (P4MS), poly(2-vinyl naphthalene) (PVN), poly(4-vinyl phenol) (PVP), poly(2-vinyl pyridine) (PVPyr) and self assembled monolayers: from the group of n-octadecylphosphonic acid, 18-phenoxyoctadecyl)trichlorosilane, docosyltrichlorosilane, hexamethyldisilazane, octadecyltrichlorosilane, poly(m-xylylene adipamide) (MXD6), poly(a-methylstyrene)(PaMS), poly(phenyl-methyl-silsesquioxane) (pPMSSQ), and/or one or more of a variety of other charge storage materials.

In some embodiments, the memory layer 106 includes a ferroelectric material that is both capable of being polarized and impervious to solvents so that the ferroelectric material will not dissolve during subsequent processing of the semiconductor device 100. However, in some embodiments, the ferroelectric material may not be impervious to solvents where the techniques used to transfer a dilute nanotube mesh does not involve a solvent (such as, e.g., PDMS stamps) and/or the semiconducting channel layer 110 is evaporated onto the source layer 108, so that the memory layer 106 is not exposed to a solvent. In some embodiments, the memory layer 106 includes a ferroelectric material including one or more of the following: poly(vinylidene difluoride) (PVDF) and its copolymer with trifluoroethylene (TrFE), nylon (poly-m-xylylene adipamide) and poly(vinyl alcohol).

Figure 2:
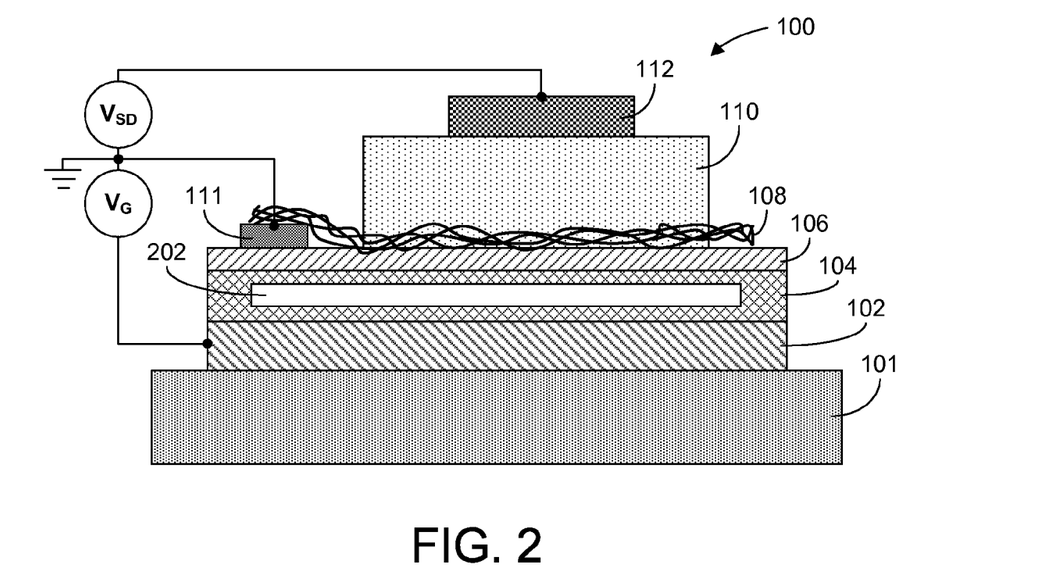

In some embodiments, the memory layer 106 and/or the dielectric layer 104 may include a floating gate 202 that is fully encased by a dielectric material. The floating gate 202 includes a layer of a conducting or semiconducting material that can store charge. The dielectric material covers the floating gate so that both the source layer 108 and the channel layer 110 do not make direct electrical contact with the floating gate 202. In some embodiments, the floating gate 202 is made of aluminum, and the dielectric material covering it includes aluminum oxide. In other embodiments, the floating gate 202 is made of silicon, and the dielectric material covering it includes silicon dioxide.

Figure 3:
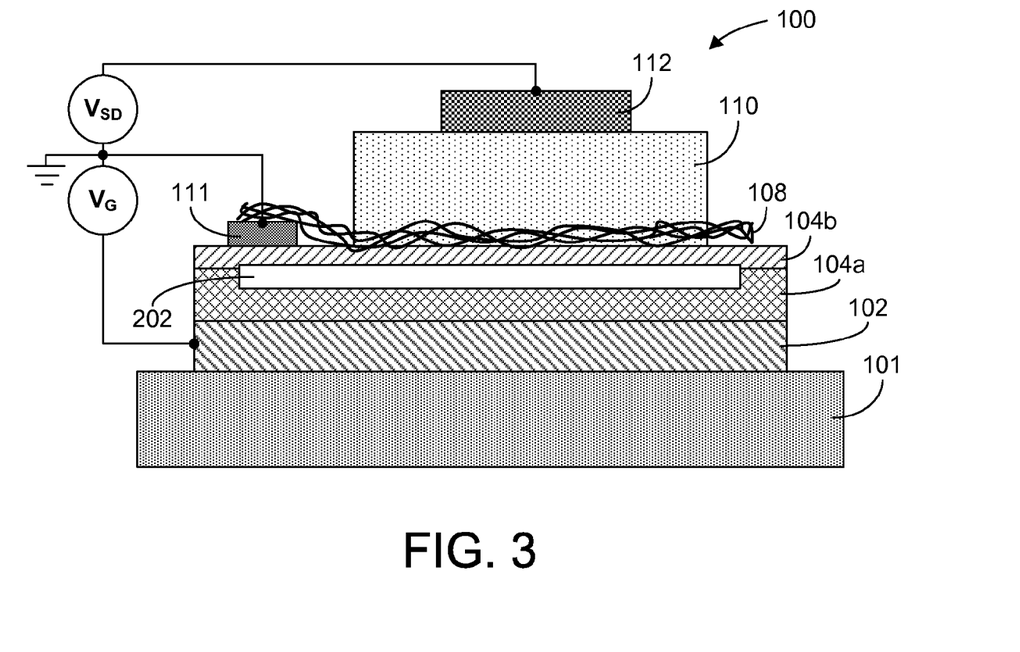

In the example of FIG. 2, the floating gate 202 is included in the dielectric layer 104 below the memory layer 106. In other embodiments, the memory layer 106 may fully or partially include the floating gate 202. The dielectric material thickness is made such that charge exchange can occur between the floating gate 202 and the source layer 108, or between the floating gate 202 and the channel layer 110, via processes such as, e.g., tunneling or hot carrier injection. In some implementations, multiple layers of dielectric material may be used to control charge exchange. For example, in the embodiment of FIG. 3, two dielectric materials 104a and 104b are used to encase the floating gate 202. In some embodiments, the dielectric material 104b may form the memory layer 106. In other embodiments, the memory layer 106 may not be included in the semiconductor device.

Referring back to FIG. 1, the source layer 108 is formed on the memory layer 106. In embodiments that do not include a memory layer 106, the source layer 108 is formed on the dielectric layer 104. The source layer 108 may include, e.g., a percolating network of carbon nanotubes (CNTs), a layer of graphene, a percolating network of metallic and/or semiconducting nanowires, or a percolating layer of a conductor, semiconductor, or semi-metal including perforations. The source layer 108 is perforated to permit a subsequently deposited layer to have direct contact with both the source layer 108 and the layer on which the source layer was formed (e.g., the memory layer 106). In the example of FIG. 1, the source layer 108 includes carbon nanotubes (CNTs) lying on their sides on the surface of the memory layer 106. The resulting nanotube source layer 108 has an electrically-interconnected random mesh of crossing and/or contiguous nanotubes due to the density of the nanotubes in the nanotube source layer 108. When viewed from above, the mesh of the nanotube source layer 108 may be sufficiently dilute to expose at least as much of the underlying surface of the a memory layer 106 as is covered by nanotubes of the nanotube source layer 108. In alternative embodiments, a dilute network of conducting or doped semiconducting nanowires can be used as the dilute but percolating film for the source layer 108, which is directly contacting the memory layer 106. Examples of such nanowires include, but are not limited to, silver nanowires and silicon nanowires. Also, nanotubes and semiconducting nanowires each have an intrinsic low density of states (DOS) in contrast to metals, which have a high DOS. In other embodiments, the source layer 108 may be a layer of graphene or a layer of a conductor, semiconductor, or semi-metal that has been configured to have perforations.

In some embodiments, the source layer 108 is a dilute, and electrically percolating, layer of individualized and/or bundled nanotubes, being primarily single wall carbon nanotubes (SWNTs), and in some embodiments, preferably including mostly SWNTs. As used herein, "dilute" refers to, e.g., a nanotube film included in the source layer 108 having substantial regions of the memory layer 106 not covered by nanotubes and there exist appreciable lengths of nanotubes and thin nanotube bundles that do not have other nanotubes or nanotube bundles that are associated with this layer crossing either above or below them or next to them. In some embodiments, the film may include semiconducting or metallic nanowires. The source layer 108 may be sufficiently dilute to expose the underlying surface in the range of, e.g., about 0.1% to about 99.9%, about 30% to about 90%, and about 50% to about 80%. Further, "percolating" refers to: (i) a nanotube or nanowire source layer 108 having a density of nanotubes (i.e., number of nanotubes per unit area) or nanowires that is sufficient to provide electrical continuity from one end of the source layer 108 to the other end or (ii) a conductor, semiconductor, or semi-metal film including frequent perforations (e.g., occurring in the nanometer range, in the picometer range and/or in the micrometer range) but retaining electrical continuity from one end of the source layer 108 to the other end. A percolating nanotube film or network can be grown directly onto the memory layer 106 or deposited by one or more of a variety of suitable methods.

The curved lines of the nanotube source layer 108 in the example of FIG. 1 are representative of the nanotube network (e.g., a CNT mesh) and meant to indicate the position of the mesh with respect to the other layers. However, the curved lines in FIG. 1 are not drawn to scale or meant to physically depict how the nanotubes actually lie on the surface of the memory layer 106. In reality, the nanotubes lie in direct contact with portions of the surface of the memory layer 106 and contact the surface of the memory layer 106 in substantially all areas. Except for their occasional crossings where one bundle passes over another, the nanotubes of the nanotube source layer 108 lie along the surface of the memory layer 106 in FIG. 1.

In some embodiments, the source layer 108 is electrically contacted by a contact pad 111 that, e.g., provides electrical contact to one or more edges of the nanotube network of the nanotube source layer 108. The contact pad 111 includes a contact material that is a metal that forms an ohmic contact with the source layer 108, e.g., with the nanotubes included in the nanotube source layer 108. Electrical contact to the source layer 108 is made via the contact pad 111 that lies along one edge of the source layer 108. FIG. 1 e.g. shows the contact pad 111 lying underneath the nanotube source layer 108. However, in some embodiments, the contact pad 111 is deposited on top of at least a portion of the source layer 108. In some implementations, the size of the semiconductor device 100 may be reduced (or minimized) by having each individual nanotube or nanotube bundle or nanowire in the source layer 108 directly connected to a metal electrode or contact pad 111.

A semiconducting channel layer 110 including a semiconducting material is formed on the source layer 108. In the embodiment of FIG. 1, the semiconducting channel layer 110 is also in contact with a portion of the memory layer 106. The source layer 108 and semiconducting channel layer 110 form a gate voltage tunable charge injection barrier. As will be discussed in further detail below, the semiconductor device 100 functions as a Schottky barrier field effect transistor (FET) in which the current modulation is due to a gate-field-induced modulation of the Schottky barrier at the interface of the source layer 108 and semiconducting channel layer 110. Since the nanotubes of a nanotube source layer 108 have an intrinsic low density of states (DOS), the Fermi level of the nanotubes can undergo an appreciable shift in response to a gate field and cause the barrier height to be lowered in addition to a field induced band bending that also thins the barrier to permit tunneling. In contrast, if the source layer 108 included metal instead of nanotubes, the source layer 108 would not allow a change in barrier height because metals have a high DOS that does not permit a Fermi level shift that will allow a change in barrier height. Although, devices with other high DOS source materials may still work due to barrier thinning, their current modulation will not be as large as with lower DOS materials. Metallic nanowires, although they have a larger density of states in bulk form can, have a low DOS due to quantum confinement when in nanowire form. The semi-metal graphene, due to its lattice structure, has a low DOS. The semiconductor device 100 still functions in a configuration in which the source layer 108 includes a metal other than nanotubes due to field-induced band bending and tunneling. However, for such configurations to function, the local field is made very high either by the use of large gate voltages or by including a dielectric material in the dielectric layer 104 that has a very large dielectric constant, thereby severely limiting the range of materials available for the dielectric layer 104. Therefore, low density of state materials such as e.g. nanotubes provide more flexibility with respect to the selection of materials for other layers, and since nanotubes are air stable, this enhances the likelihood of commercialization of the semiconductor device 100 including nanotubes.

As mentioned above, the semiconducting channel layer 110 includes a semiconducting material. The semiconducting channel layer 110 includes an organic or inorganic semiconducting material. Operationally, the top of the valence band of an inorganic semiconductor is equivalent to the highest occupied molecular orbital (HOMO) level of a molecular or polymeric organic semiconductor. While, the bottom of the conduction band of the inorganic semiconductor is equivalent to the lowest unoccupied molecular orbital (LUMO) level of a molecular or polymeric organic semiconductor. In the following discussion, valence band levels and conduction band levels refer to their usual meaning for inorganic semiconductors and their equivalents for molecular and polymeric semiconductors.

The semiconducting material of the semiconducting channel layer 110 is such that the HOMO of the semiconducting material lies within reach of the Fermi level of the nanotubes of the nanotube source layer 108 for realistically applicable gate fields induced by the gate layer 102. The following descriptions illustrate what happens if the semiconducting material does not lie within reach of the Fermi level of the nanotubes.

If the HOMO of the semiconducting material lies above the Fermi level of the nanotubes, the gate field has to generate a barrier at the accumulation layer (anti-barrier) for holes. Accordingly, the semiconductor device 100 would have a normally-on (anti-barrier) band line-up for the semiconducting channel layer 110 and the nanotube source layer 108. Additionally, when the nanotube source layer 108 includes nanotube bundles, the nanotube bundles may self screen and affect whether the channel of the semiconductor device 100 can be turned off. For example, the top nanotubes in a bundle may be screened from the gate layer 102, and the gate field of the gate layer 102 cannot switch the respective barriers off. Because those nanotubes permit current flow independent of the gate field induced by the gate layer 102, such a normally-on semiconductor device 100 cannot be turned off effectively and greatly reduces the ON/OFF current ratio.

In contrast, if the HOMO of the semiconducting material lies below the Fermi level of the nanotubes, the gate layer 102 has to reduce the pre-existing barrier. Accordingly, the semiconductor device 100 would have a normally-off band line-up for the semiconducting channel layer 110 and the nanotube source layer 108. Further, the $I_{DS}$ current is switched on by the nanotubes near the bottom of the bundles of the nanotube source layer 108. Although the top nanotubes in the bundles of the nanotube source layer 108 participate little in the switching, they do not degrade the ON/OFF current ratio.

Accordingly, by using a semiconducting material for the semiconducting channel layer 110 that has an appropriate HOMO level or valence band edge, or LUMO level or conduction band edge, the issues associated with being able to control the semiconductor device 100 using the gate layer 102 can be mitigated. The following description of semiconducting materials for the semiconducting channel layer 110 assumes that the work function of the nanotube source layer 108 is about −5.0 eV. Possible p-channel materials to serve as the semiconducting channel layer 110 include semiconducting materials with a HOMO level or valence band edge energy of about −5.0 eV to about −7.0 eV. Additionally, when the nanotube source layer 108 includes nanotube bundles, the semiconducting material of the semiconducting channel layer 110 may be one or more of the following materials that has a HOMO level reasonably deeper than the work function of the nanotubes in the bundles (i.e., in the range of about −5.2 eV to about −7.0 eV, when the work function of the nanotubes is about −5.0 eV): N N,N'-di(1-naphthyl)-N,N'-diphenyl-1,1'-diphenyl-1,4'-diamine) (NPD), poly[(9,9-dioctyl-fluorenyl-2,7-diyl)-alt-co-(9-hexyl-3,6-carbazole)] (PF-9HK) and poly (9,9-dioctyl-fluorene-co-N-(4-butylphenyl)-diphenylamine) (TFB). In addition to the semiconducting materials listed for the semiconducting channel layer 110 of the p-channel semiconductor device 100 with a nanotube source layer 108 that included bundled nanotubes, a semiconducting material with a HOMO level that forms an negligible hole injection barrier with the nanotube work function of about −5.0 eV may also be employed and can be chosen from one or more of the following organic or inorganic semiconducting materials with a HOMO level or valence band edge energy of about −5.0 eV to about −5.2 eV: polycrystalline silicon, pentacene, poly (3-hexylthiophene) (P3HT), rubrene, and tetracene. In some embodiments, the valence band edge or HOMO level of the semiconducting channel layer 110 is within a range of about −1.5 eV to about +1.5 eV of the work function of the source layer 108.

Likewise for a semiconductor device 100 that is an n-channel device, possible materials included in the semiconducting channel layer 110 include semiconducting materials with a LUMO level or conduction band edge energy of about −3.0 eV to about −5.0 eV. Additionally, when the nanotube source layer 108 includes nanotube bundles, the use of a semiconducting channel layer 110 with a LUMO level forming a normally off band line-up with the nanotube source layer 108 (i.e., an electron injection barrier) with said LUMO level of about −3.0 eV to about −4.8 eV (when the work function of the nanotubes is about −5.0 eV) permits transistor action gating the electron current. Applicable materials for the semiconducting channel layer 110 include: DFHCO-4T), which is sometimes described by its chemical formula 5,5'''-diperfluorohexylcarbonyl-2,2':5',2'':5'',2'''-quaterthiophene, DFH-4T, DFCO-4T, P(NDI2OD-T2), PDI8-CN2, PDIF-CN2, $F_{16}$CuPc and fullerene, naphthalene, perylene, and oligothiophene derivatives. For a n-channel semiconductor device 100, in addition to the semiconducting materials listed for the semiconducting channel layer 110 with a nanotube source layer 108 that included bundled nanotubes, a semiconducting material with a LUMO level that forms a negligible electron injection barrier with the nanotube work function of about −5.0 eV may also be employed and can be any organic or inorganic semiconductor with a LUMO level or conduction band edge energy of about −4.8 eV to about −5.0 eV. In some embodiments, the conduction band edge or LUMO level of the semiconducting channel layer 110 is within a range of about −1.5 eV to about +1.5 eV of the work function of the source layer 108.

When the nanotube source layer 108 includes individual nanotubes, the semiconducting channel layer 110 can also include semiconducting materials that form a negligible injection barrier with the nanotubes. Negligible means that the offset between the nanotube work function and either the HOMO or LUMO level of the semiconducting channel layer 110 is less than about 0.2 eV. This is because individualized nanotubes have a smaller diameter than bundled nanotubes and are not expected to suffer from the screening mechanism previously described, thereby allowing a charge injection barrier to be created through application of a gate field to turn the device off.

The semiconducting channel layer 110 may include an organic semiconducting material is formed on the source layer 108. The organic semiconducting material of the semiconducting channel layer 110 can include a linearly condensed polycyclic aromatic compound (or acene compound) such as, e.g., naphthalene, anthracene, rubrene, tetracene, pentacene, hexacene, and derivatives thereof; a pigment such as, e.g., copper-phthalocyanine (CuPc)-based compounds, azo compounds, perylene-based compounds, and derivatives thereof; a low-molecular compound such as, e.g., hydrazone compounds, triphenyl methane-based compounds, diphenylmethane-based compounds, stilbene-based compounds, arylvinyl compounds, pyrazoline-based compounds, triphenyl amine derivatives (TPD), arylamine compounds, low-molecular weight arylamine derivatives (α-NPD), 2,2',7,7'-tetrakis(diphenylamino)-9,9'-spirobifluorene (Spiro-TAD), N,N'-di(1-naphthyl)-N,N'-diphenyl-4,4'-diamonobiphenyl (Spiro-NPB), 4,4',4''-tris[N-3-methylphenyl-N-phenylamino]-triphenylamine (mMTDATA), 2,2',7,7'-tetrakis(2,2-diphenylvinyl)-9,9-spirobifluorene (Spiro-DPVBi), 4,4'-bis (2,2-diphenylvinyl)biphenyl (DPVBi), (8-quininolinolato) aluminum (Alq), tris(8-quinolinolato)aluminum (Alq3), tris (4-methyl-8quinolinolato)aluminum (Almq3), and derivatives thereof; a polymer compound such as, e.g., polythiophene, poly(p-phenylenevinylene) (PPV), polymers containing biphenyl groups, polymers having dialkoxy groups, alkoxyphenyl-PPV, phenyl-PPV, phenyl/dialkoxy-PPV copolymer, poly(2-methoxy-5-(2'-ethylhexyloxy)-1,4-phenylenevinylene) (MEH-PPV), poly(ethylenedioxythiophene) (PEDOT), poly(styrenesulfonic acid) (PSS), poly(aniline) (PAM), poly(N-vinylcarbazole), halogenated poly(N-vinylcarbazole), poly(vinylpyrene), poly(vinylanthracene), pyrene-folmaldehyde resin, ethylcaxbazole-folmaldehyde resin, and modifications thereof; an n-type transporting organic small molecule, oligomer or polymer such as, e.g., DFHCO-4T), which is sometimes described by its chemical formula 5,5'''-diperfluorohexylcarbonyl-2,2':5',2'': 5'',2'''-quaterthiophene, DFH-4T, DFCO-4T, P(NDI2OD-T2), PDI8-CN2, PDIF-CN2, $F_{16}$CuPc and fullerene, naphthalene, perylene, and oligothiophene derivatives; and/or an inorganic semiconductor such as, e.g., zinc oxide (ZnO) and silicon.

The drain layer 112 is formed on the semiconducting channel layer 110, and the drain layer 112 includes a conducting material. The drain layer 112 may include a layer of carbon nanotubes, a contiguous metallic film, a contiguous semiconducting film, a contiguous transparent conducting oxide, or a layer of semiconducting nanowires. For example, in some embodiments, the drain layer 112 includes a thin Pd metallization deposited directly on top of the semiconducting channel layer 110. In other embodiments, the drain layer 112 may include a metal such as, e.g., gold. In other embodiments, the drain layer may include a layer of nanotubes. In some implementations, the size of the semiconductor device 100 may be reduced (or minimized) by utilizing an individual nanotube in the drain layer 112, with the nanotube connected to a metal electrode.

The device arrangement described herein can be embodied as a transparent semiconductor device 100. Rather than a silicon back gate as the gate layer 102, the gate layer 102 can be a conducting material that is optically transparent, such as indium tin oxide, or a thin SWNT film that is deposited onto a transparent insulating substrate 101. The transparent gate layer 102 can then be covered by an optically transparent dielectric layer 104 followed by an optically transparent memory layer 106, followed by the dilute, percolating, source layer 108 followed by the rest of the device layers as mentioned. A transparent conducting material can also be used for the drain layer 112, such as a thin nanotube film or bi-layer of a thin metal followed by a transparent conducting oxide layer. In some embodiments, the insulating substrate 101, gate layer 102, the dielectric layer 104, the memory layer 106, the source layer 108, the semiconducting channel layer 110, and the drain layer 112 are all optically transparent. The configuration described is also amenable to the fabrication of flexible transistors requiring that SWNT films be used for the source, drain and gate layers with a flexible dielectric layer 104, a flexible memory layer 106, constructed on a flexible insulating substrate 101. In some embodiments, the insulating substrate 101, gate layer 102, the dielectric layer 104, the memory layer 106, the source layer 108, the semiconducting channel layer 110, and the drain layer 112 are all flexible.

Figure 4:
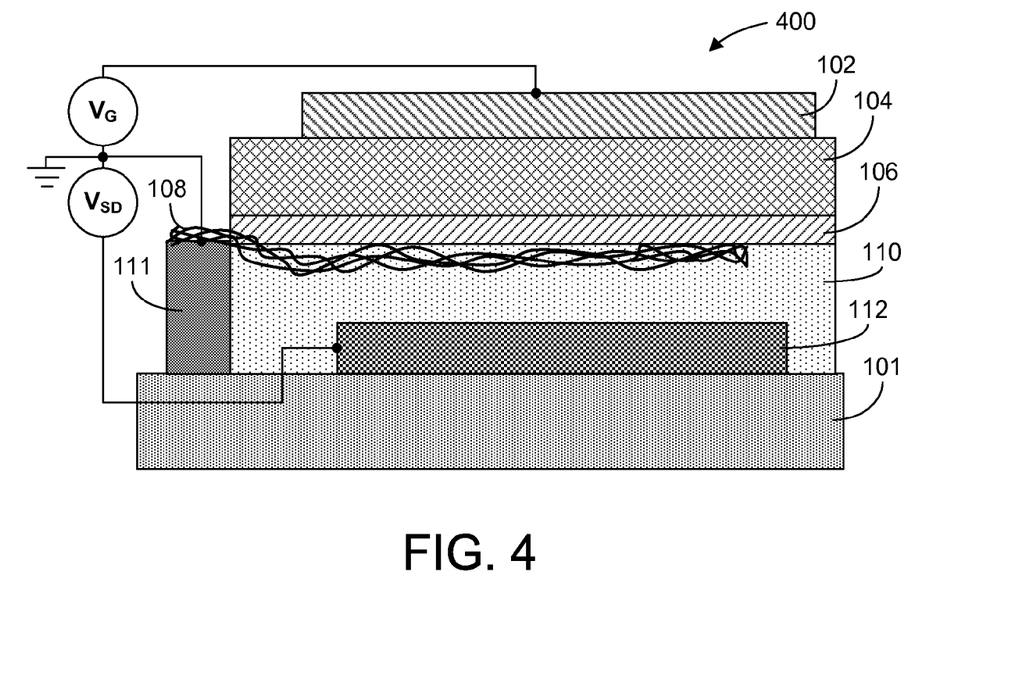

Referring next to FIG. 4, shown is a cross-sectional, two-dimensional diagram (with thickness not to scale) of a non-limiting embodiment of another semiconductor device 400. The top-gated semiconductor device 400 comprises the following layers: an insulating substrate 101, a gate layer 102, a dielectric layer 104, a memory layer 106, contact pad 111, a source layer 108, a semiconducting channel layer 110, and a drain layer 112. The insulating substrate 101 insulates the drain layer 112, which is formed on the insulating substrate 101. A semiconducting channel layer 110 including a semiconducting material is formed on the drain layer 112. The source layer 108 is formed on the semiconducting channel layer 110. The source layer 108 is perforated to permit a subsequently deposited layer to have direct contact with both the source layer 108 and the layer on which the source layer was formed. At least a portion of the source layer 108 is in contact with the contact pad 111. A memory layer 106 is formed over the source layer 108 in contact with it and in contact with the semiconducting channel layer 110. The dielectric layer 104 is formed on the memory layer 106 and the gate layer 102 is formed on the dielectric layer 104. In some embodiments, source layer 108 including each individual nanotube or nanotube bundle directly contacted by metal electrodes is used to reduce or minimize the size of the semiconductor device 400.

Figure 5:
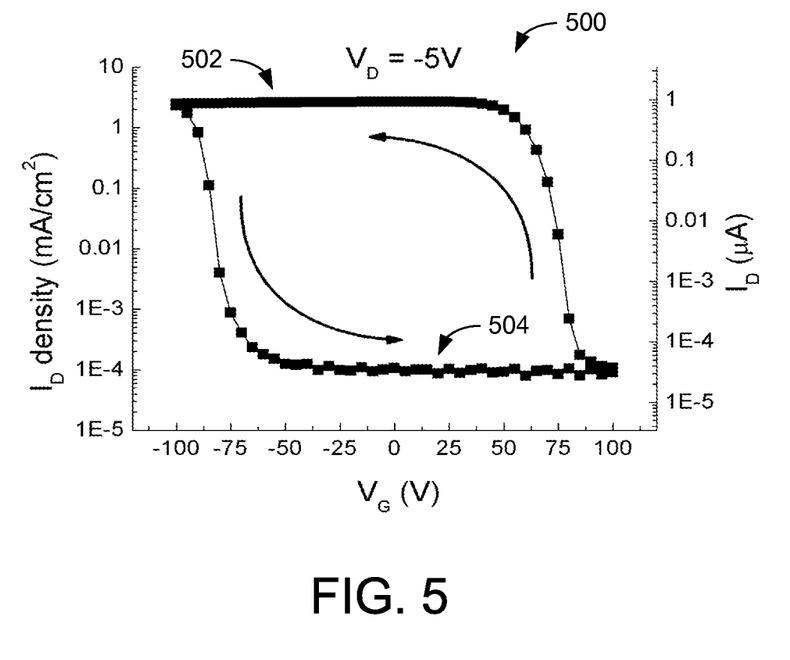
FIGS. 5-8 are graphical representations of cyclic transfer curves associated with semiconductor devices of FIG. 1 in accordance with various embodiments of the present disclosure.

Next, with reference to FIG. 5, shown is a cyclic transfer curve 500 for an embodiment of the semiconductor device 100 depicted in FIG. 1, comprising a gate layer 102 that includes degeneratively doped p-type Si, a memory layer 106 that includes BCB, a nanotube source layer 108 including a carbon nanotube dilute network, a contact pad 111 including palladium, a semiconducting channel layer 110 that includes poly(9,9-dioctyl-fluorene-co-N-(4-butylphenyl)-diphenylamine) (TFB), and a drain layer 112 that includes gold.

As can be seen in FIG. 5, the ON/OFF ratio between the drain current ($I_D$) 502 in the ON-state and $I_D$ 504 in the OFF-state of the semiconductor device 100 (FIG. 1) is more than 4 orders of magnitude. At about −5 V drain-source voltage ($V_{SD}$), the ON-state current 502 is about 0.8 µA for about a 0.035 mm$^2$ pixel size, corresponding to a current density of about 2.3 mA/cm$^2$. Note that injection into the semiconducting channel layer 110 (FIG. 1) occurs over the entire overlap area between the nanotube source layer 108 (FIG. 1) and the drain layer 112 (FIG. 1) so that an areal current density is sensibly defined, just as for organic light emitting diodes and organic solar cells. The low driving voltage of the semiconductor device 100 is an improvement over organic thin film transistors.

In devices similar to that for which FIG. 5 shows the cyclic transfer curve 500, sub-micron particulates in the nanotube source material limited how thin the semiconducting channel layer 110 could be made before direct shorts between the nanotube source layer 108 and drain layer 112, respectively, rendered the devices inoperable. The semiconducting channel layer 110 of at least 350 nm in thickness of this embodiment avoided such direct shorts. In some embodiments, the thickness of the semiconducting channel layer 110 may be as small as about 1-2 nm. The semiconducting channel layer 110 thickness can be in a range of, e.g., about 1 nm to about 5000 nm. Note that for a lateral organic FET, a 350 nm channel length would require expensive high resolution patterning. With elimination/reduction of source material particulates, the semiconducting channel layer 110 can be made thinner, allowing still higher current densities to be realized, which will benefit device operation because of low ON-state channel resistance (as indicated by the ability to drive higher currents) thereby improving the reading speed and reducing the power consumption of the semiconductor device 100.

From the cyclic transfer curve 500, a hysteresis of about 157 V is shown for a gate voltage scan of −100V to +100V. Large hysteresis is useful for non-volatile memory applications. The large gate voltages used here are due to dielectric layer 104 (FIG. 1), which includes a thermal oxide having a thickness of about 200 nm to avoid gate leakage currents. The gate voltage required should be greatly reduced by reduction of the thickness of the dielectric layer 104, without compromising the memory characteristics.

In the present embodiment, about a 12 nm thick BCB layer was designed as a charge storage layer to serve as the memory layer 106 (FIG. 1). BCB was selected because it is commercially available, easy to process and stable after curing. As a Si-based polymer containing Si—O bonds and aromatic rings, BCB has been shown to have excellent ambipolar charge storage ability with good stability. The direction of the cyclic transfer curves indicates the origin of the hysteresis. For a semiconductor device 100 including a p-channel, an anticlockwise or lower back sweep current (lower BSC) hysteresis is generated by charge storage in dielectrics near the channel. Indeed, strong lower BSC hysteresis can be seen in the cyclic transfer curves of the semiconductor devices, indicating that charge storage is the origin of the hysteresis.

Figure 6:
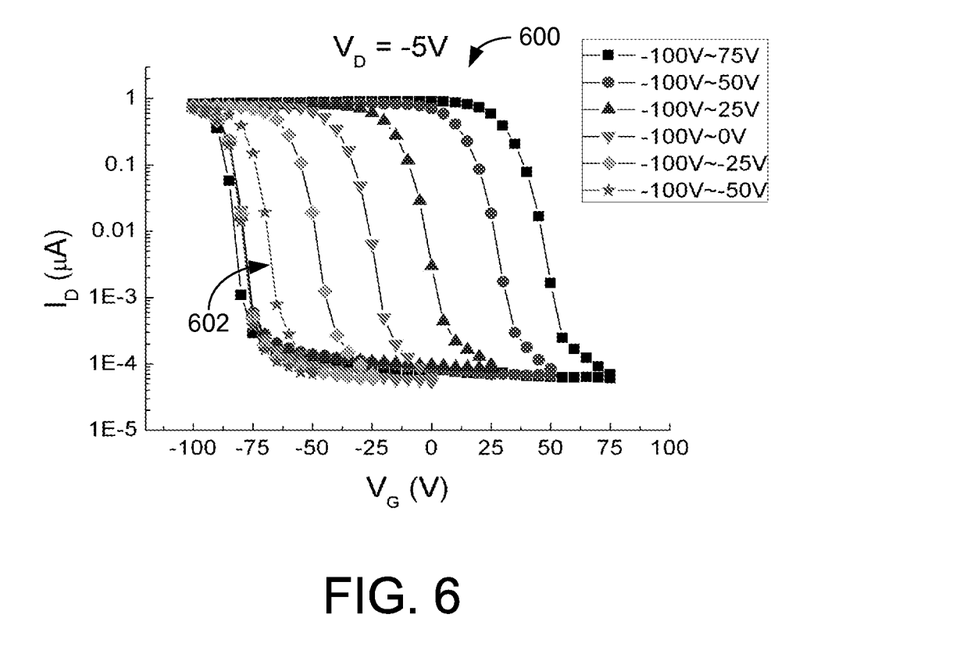

To further demonstrate that the hysteresis is due to charge storage in the memory layer 106, cyclic transfer curves 600 over distinct gate voltage ($V_G$) ranges are illustrated in FIG. 6.

Figure 7:
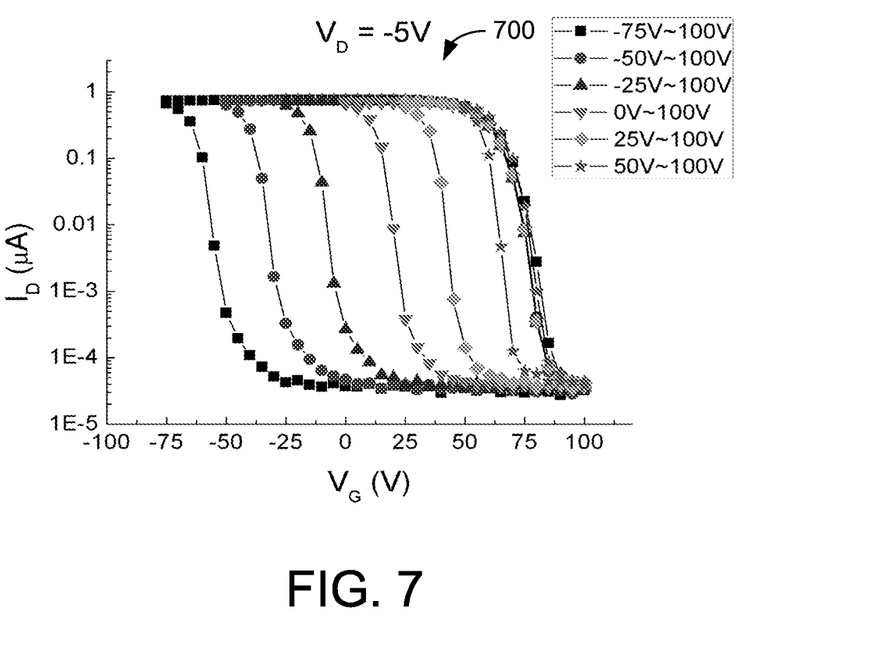

A trend shown in FIG. 6 is a shift of threshold voltages that follow the "turn back point" gate voltage in the scan. The shift mechanism can be understood on the basis of electrostatics as follows. Suppose, without loss of generality, that $V_G$ is at its most negative value. In order to balance the negative charge accumulated on the gate layer 102 (FIG. 1), both the nanotube source layer 108 (FIG. 1) and the memory layer 106 (FIG. 1) contain a compensating amount of positive charge. The positive charge on the carbon nanotubes of the source layer 108 depresses the contact barrier with the semiconducting channel layer 110 (FIG. 1) allowing for hole injection so that the p-channel device is in its ON-state. Now scan the gate voltage towards zero, but only to about −50 V (curve 602 in FIG. 6). In response to the decreasing $V_G$ the negative charge on the gate layer 102 and the corresponding positive charge on the combination of the nanotube source layer 108 and memory layer 106 is reduced, but the charge on the memory layer 106 is trapped and less easily drained. To maintain electrostatic charge balance, the positive charge on the carbon nanotubes of the nanotube source layer 108 is preferentially drained, raising their contact barrier with the semiconducting channel layer 110, resulting in the rapid turn off of the channel. At the first turn back point (−50 V) much of the trapped charge has remained in the memory layer 106 so as $V_G$ becomes more negative again the positive charge in the nanotube source layer 108 is quickly replenished rapidly turning the channel back on again. If $V_G$ is returned to about −100 V in each excursion, this behavior occurs for any turn back point so that the apparent threshold voltage at which the channel turns on shifts to lie near the $V_G$ where the scan changes direction and turns back. As illustrated by the cyclic transfer curves 600 of FIG. 6, the memory layer 106 can store negative charge as well as positive charge so this behavior holds for both negative and positive $V_G$ turn-back points. Symmetric behaviors are also shown, by the cyclic transfer curves 700 of FIG. 7, for $V_G$ scans that always return to +100V. There the apparent threshold voltages at which the channel turns off shifts to lie near the turn back point. The hysteresis in the semiconductor device 100 is thus fully programmable, depending on the $V_G$ turn back points and can even be made effectively zero by restricting the scan range as illustrated by the cyclic transfer curves 800 of FIG. 8.

Figure 9:
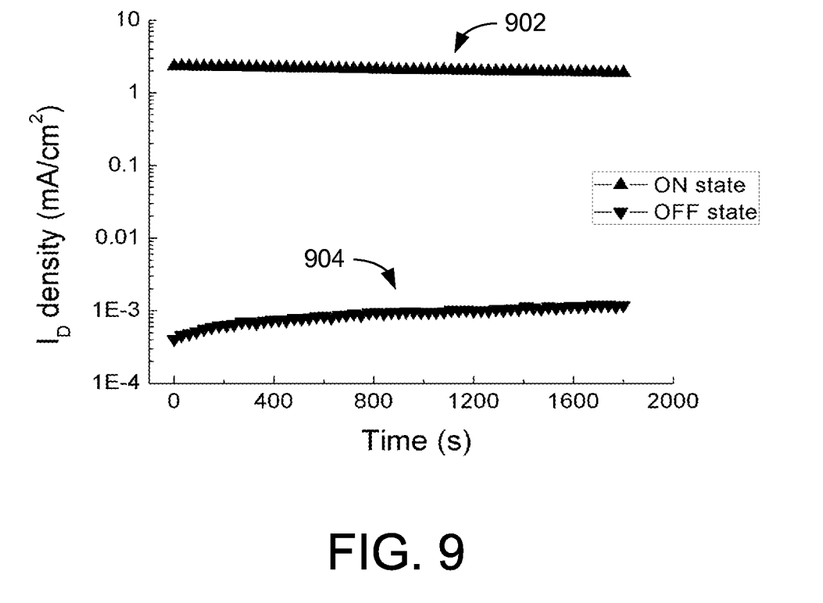
FIG. 9 is a graphical representation illustrating ON/OFF-state stability of a semiconductor device of FIG. 1 in accordance with various embodiments of the present disclosure.

Stability in each state of a non-volatile semiconductor device is useful. FIG. 9 shows the stability of the semiconductor device 100 (FIG. 1) for both ON and OFF states, respectively. To set the semiconductor device 100 to its ON-state, $V_G$ was scanned to 100 V, and then scanned back to 0 V. The OFF-state was set by scanning $V_G$ to −100 V first and back to 0 V. After 30 minutes the ON-state source-drain current 902 was still more than 3 orders of magnitude higher than the OFF-state $I_D$ 904, indicating relatively good charge storage stability of the BCB layer. However, BCB is not typically used as a charge storage material. Charge relaxation leads to charge loss in the memory layer 106 (FIG. 1), which can be seen from the gradual decay of the ON-state $I_D$ 902 and corresponding increase in the OFF-state $I_D$ 904. A more stable semiconductor device 100 is possible with the use of a charge storage material that exhibits a greater barrier to charge exchange with the CNTs.

The material included in the memory layer 106 to serve as a charge storage layer is a material that exhibits an energy barrier to charge exchange with the nanotube source layer 108. Overcoming that barrier and transferring charge into (or out of) the memory layer 106 involves a characteristic minimum change in the gate voltage $V_G$ that is referred to as the critical threshold voltage, $\Delta V_C$. This critical threshold voltage $\Delta V_C$ is independent of the charge already stored in the charge storage layer 106 and independent of the sign of the stored charge. Suppose that for given gate voltage $V_{G0}$, the quantity of charge in the memory layer 106 is $Q_0$. Increasing the quantity of charge Q in the memory layer 106 to $Q_0+\Delta Q$ involves a corresponding minimum change in the gate voltage $V_G$ of $\Delta V_D$, resulting in a new value of the gate voltage $V_G$ of $V_{G0}+\Delta V_D$. A return of the gate voltage $V_G$ to the given gate voltage $V_{G0}$ does not correspondingly return the quantity of charge Q in the memory layer 106 to $Q_0$. Rather, returning the quantity of charge Q in the memory layer 106 to $Q_0$ requires that the gate voltage $V_G$ be reduced to $V_{G0}-\Delta V_C$. Thus, for any given gate voltage $V_{G0}$, so long as the gate voltage $V_G$ changes are less than $\pm\Delta V_D$, the charge state of the memory layer 106 does not change. Since the semiconductor device 100, when used as a memory element, relies on hysteresis to define a plurality of memory states, and the hysteresis in turn requires distinct charge states of the memory layer 106, the quantity $\pm\Delta V_D$, which is a characteristic of the charge storage material used (as well as the dielectric layer 104 material and thickness and memory layer 106 thicknesses), sets the lower limit for the write and erase voltages for the semiconductor device 100, when used as a memory element.

In some embodiments, the semiconductor device 100 is operated as a transistor instead of a memory element. In transistors, hysteresis is undesirable. However, carbon nanotube vertical field effect transistors (CN-VFETs) (without the memory layer 106) generally exhibit substantial hysteresis. The memory layer 106 of the semiconductor device 100 helps mitigate hysteresis effects normally observed without the memory layer 106 when the semiconductor device 100 is operated as a transistor so long as the range of gate voltage is limited to be less than $\pm\Delta V_C$.

Figure 8:
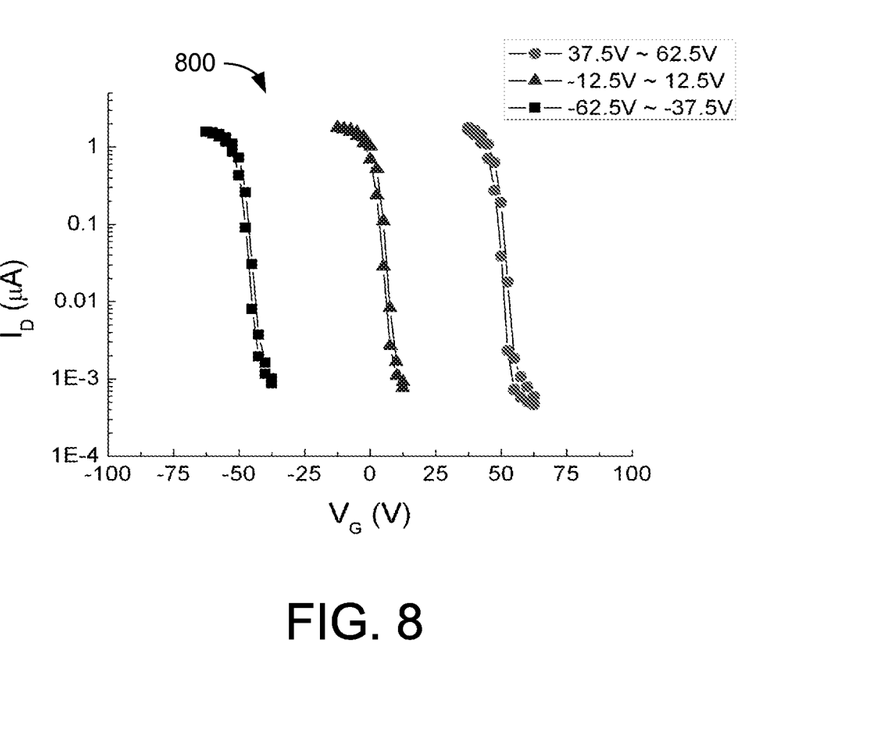

Referring back to FIG. 8, the curves 800 demonstrate that the hysteresis is near zero with the inclusion of BCB in the memory layer 106 (FIG. 1) while limiting the range of gate voltages applied to the semiconductor device 100 (FIG. 1). As shown in FIG. 8, for an $SiO_2$ dielectric layer of about 200 nm thickness with about a 12 nm thick BCB layer, when the gate voltage range is limited to a span of about <25 V (i.e., the range $\pm\Delta V_C$ is about 25V, under these conditions), there is little hysteresis. Thus, the hysteresis that is observed when the semiconductor device 100 is operated as a memory element is mitigated when the semiconductor device 100 is operated as a transistor in a limited gate voltage span. Moreover, this nearly hysteresis-free operation can be programmed to occur about any desired gate voltage by the initial gate voltages (about >25 V) applied to the semiconductor device 100 as demonstrated by the shifted curves 800 in FIG. 8.

The limited gate voltage range that permits nearly hysteresis-free operation in the semiconductor device 100 also however limits the ratio of the ON current to the OFF current in the device. Large ON/OFF current ratios are desirable in transistors, and so for this purpose memory layers that have larger $\pm\Delta V_C$ to permit larger voltage swings and thereby go further on and off (increasing their ON/OFF ratio) are desirable. The charge storage layer 106 is such that charge exchange between the source layer 108 and the charge storage layer 106 only occurs if the gate voltage exceeds a critical threshold gate voltage, thereby operating as a hysteresis-free transistor with a programmable threshold voltage.

The deleterious hysteresis in CN-VFETs (that do not have a purposely-employed memory layer 106) arises because of charge traps in a dielectric layer 104 (e.g., silicon oxides and nitrides). These charge traps can also store charge and thereby induce hysteresis in the devices. However, unlike for a purposely-employed memory layer 106 for which the energy barrier to charge exchange and correspondingly $\pm\Delta V_C$ can be a well defined value, the barrier to charge exchange with the dielectrics is variable, and small, leading to a small effective $\pm\Delta V_C$. This restricts the hysteresis-free gate voltage scan range and the corresponding hysteresis-free ON/OFF current ratio in these devices. Incorporation of a charge storage layer 106 selected for its large $\pm\Delta V_C$ (about >25V), such as in the semiconductor device 100 using BCB as the charge storage layer, improves the performance of the semiconductor device 100 when the semiconductor device 100 is operated as a transistor in the limited gate voltage span of about <25 V, as discussed above.

Figure 10:
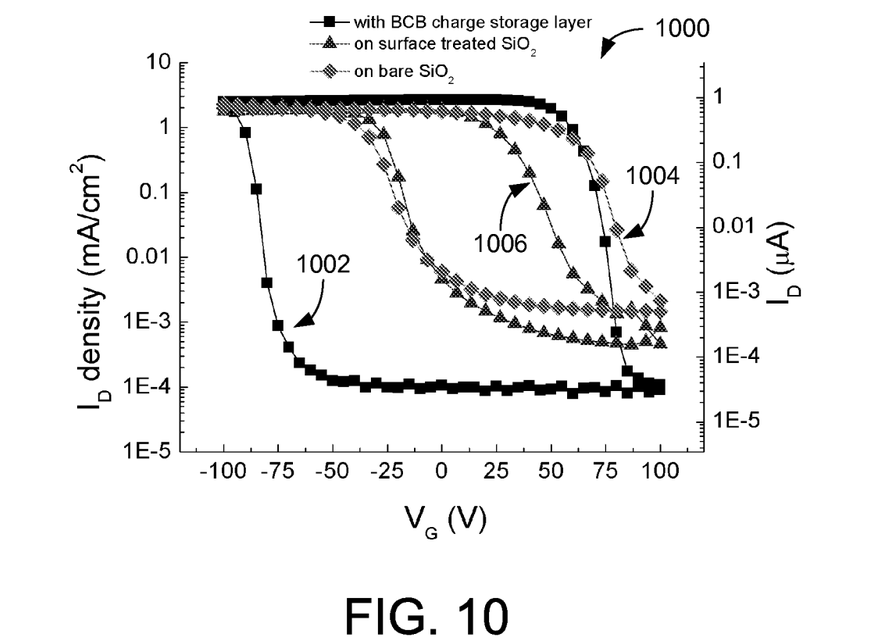
FIG. 10 is a graphical representation of cyclic transfer curves associated with semiconductor devices of FIG. 1 with and without a charge storage layer in accordance with various embodiments of the present disclosure.

Referring to FIG. 10, shown is a comparison of the cyclic transfer curves 1000 of a memory element including a BCB charge storage layer 106 (corresponding to curve 1002) and two control CN-VFETs without a charge storage layer. All devices were built on a p-Si substrate with a 200 nm thick thermal oxide layer. The first control device (corresponding to curve 1004) was built on the untreated SiO2 dielectric layer. For the second control device (corresponding to curve 1006), the oxide surface was treated by a commercially available water repellent (Rain X) to render the oxide surface hydrophobic. All other parameters for the three devices were identical. For a gate voltage scan range between –100 V and +100 V, the hysteresis for the memory element (curve 1002) was about 157 V, while the hysteresis for the control devices (without BCB) is about 98 V and about 64 V (curves 1004 and 1006), respectively. The memory element showed symmetric hysteresis between the up (starting from Vg=+100 V) and down (starting from Vg=–100 V) scans, demonstrating a good charge storage capability of BCB for both negative and positive charge. The hysteresis in the control devices (curves 1004 and 1006) is offset because $SiO_2$ is dominated by electron traps as opposed to BCB which traps holes with apparently equal efficiency.

Figure 11:
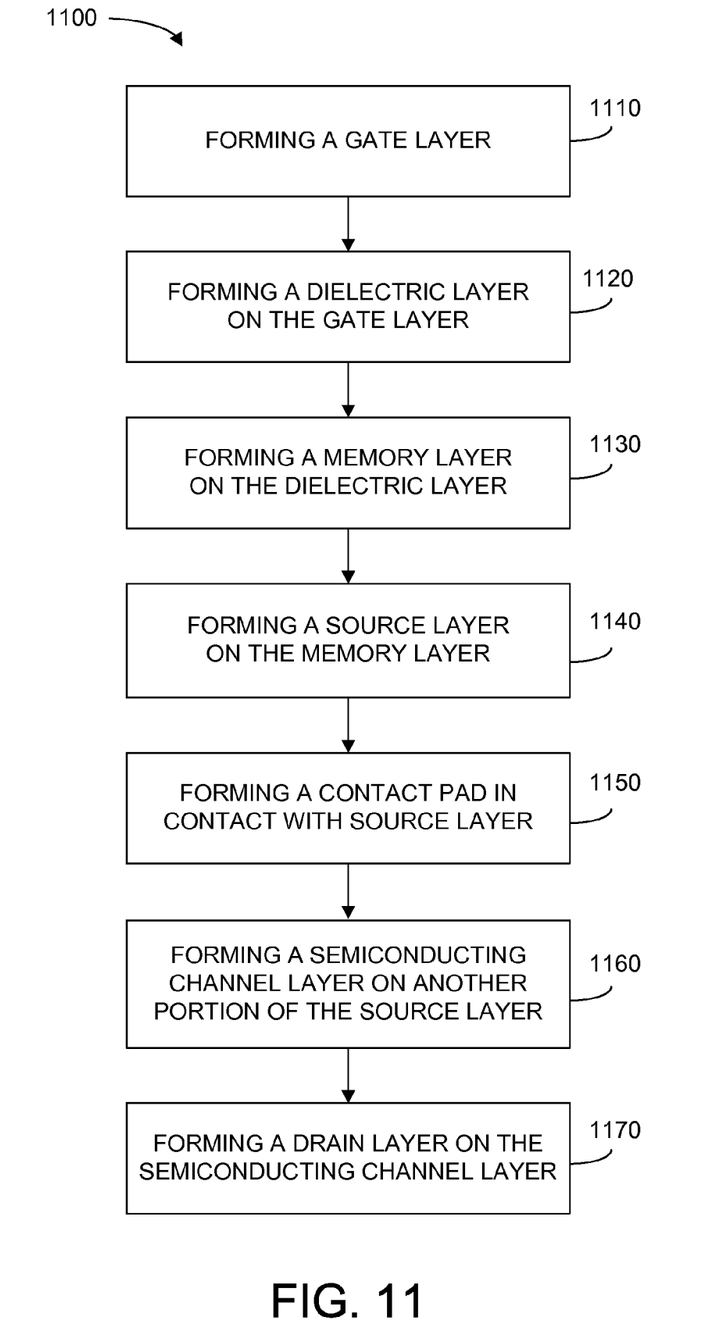
FIG. 11 is a flowchart illustrating the fabrication of a semiconductor device of FIG. 1 layer in accordance with various embodiments of the present disclosure.

Turning now to FIG. 11, illustrated is a method of fabricating a semiconductor device 100 (FIG. 1) according to various embodiments of the present disclosure. It is understood that the flowchart 1100 of FIG. 11 provides merely an example of the many different steps that may be employed to implement the fabrication of a semiconductor device 100 as described herein. In block 1110, a gate layer 102 (FIG. 1) is formed on a substrate 101 (FIG. 1), and in block 1120, a dielectric layer 104 (FIG. 1) is formed on the gate layer 102. In block 1130, a memory layer 106 (FIG. 1) is formed on the dielectric layer 104. The memory layer 106 may include a self-assembled molecular monolayer, a polymer deposited through a liquid solution, or a polymer deposited through a liquid solution with embedded nanoparticles, such as Au nanoparticles embedded in a polymethyl methacrylate (PMMA) layer. In some embodiments, a floating gate 202 (FIG. 2) is included in the dielectric layer 104 and/or memory layer 106.

In block 1140, a source layer 108 (FIG. 1) is formed on the memory layer 106. The source layer 108 may be, e.g., an electrically percolating network of carbon nanotube(s), a layer of graphene, an electrically percolating network of one or more metallic and/or semiconducting nanowire(s), or an electrically percolating layer of a conductor, semiconductor, or semi-metal that has been configured to have perforations, by a process such as, but not limited to, evaporation through a photolithographically defined mask or a mask defined by self assembled nanoparticles, deposition of a continuous film followed by masking and etching, etching to be performed by solution chemistry or by reactive species (e.g. by partially oxidation) with or without a plasma activation and or bombardment. In the case of, a nanotube source layer 108 includes at least one nanotube. The source layer 108 is perforated to permit a subsequently deposited layer to have direct contact with both the source layer 108 and the layer on which the source layer was formed (e.g., the memory layer 106).

In block 1150, a contact pad 111 (FIG. 1) is formed in contact with at least a portion of the source layer 108. For example, the contact pad 111 may be formed on at least a portion of a nanotube source layer 108. Also, in some embodiments, electrical contact to the nanotube source layer 108 is formed by depositing the contact pad 111 on the memory layer 106 prior to forming the nanotube source layer 108.

In block 1160, a semiconducting channel layer 110 (FIG. 1) is formed on another portion of the source layer 108 such that the semiconducting channel layer 110 is in contact with both the source layer 108 and the memory layer 106. The thickness of the semiconducting channel layer 110 (i.e., the channel length of the semiconductor device 100) is determined by the processing parameters in the method of depositing the semiconducting channel layer 110, such as spin-coating, thermal evaporation, and/or one or more of a variety of other thin film deposition techniques. In some embodiments the semiconducting channel layer 110 is formed on the source layer 108 by a thin film deposition technique such as resistive thermal evaporation, sputtering, spin-coating, ink-jet printing, vapor-jet printing, drop-casting, electrochemical deposition or other means that may provide fine control over the channel layer thickness. In some embodiments, the semiconducting channel layer 110 is as thin as a single molecular layer (e.g. about 1 nm) or hundreds of nanometers thick (e.g., about 500 nm) or more, or one of a variety of thicknesses in between, with thickness control provided by the deposition parameters. Significantly, the thickness of the semiconducting channel layer 110 coating the source layer 108 defines the channel length of the semiconductor device 100.

The substrate can be heated during the deposition to enhance the crystallinity of the semiconducting channel layer 110 or kept at room temperature to attain an amorphous phase. The deposition parameters can be modified to increase the amorphous phase percent of the channel layer such as by increasing the growth rate during a resistive thermal evaporative type of deposition method. It should be noted that due to the vertical architecture of the device, in some embodiments an amorphous channel layer is preferred to prevent shorting paths through grain boundaries. If an amorphous phase cannot be attained at room temperature conditions and high growth rates, then the smaller crystallite size of the films versus films grown at higher temperatures and slower growth rates should permit a more "amorphous like" film and bring with it the benefits of an amorphous film. Alternatively, the semiconductor device 100 can be subjected to a post evaporation heating cycle to improve the crystallinity of the semiconducting channel layer 110 if it deemed necessary.

In block 1170, a drain layer 112 (FIG. 1) is formed on the semiconducting channel layer 110. The drain layer 112 may be, e.g., a layer of one or more carbon nanotube(s), a contiguous metallic film, a contiguous semiconducting film, a contiguous transparent conducting oxide, or a layer of one or more semiconducting nanowire(s).

Although the flowchart of FIG. 11 shows a specific order of execution, it is understood that the order of execution may differ from that which is depicted. For example, the order of execution of two or more blocks may be scrambled relative to the order shown. Also, two or more blocks shown in succession in FIG. 11 may be executed concurrently or with partial concurrence. Further, in some embodiments, one or more of the blocks shown in FIG. 11 may be skipped or omitted. It is understood that all such variations are within the scope of the present disclosure.

With reference back to FIG. 4, the blocks of flowchart 1100 may be reordered for fabricating a top-gated semiconductor device 400 according to various embodiments of the present disclosure. For example, a drain layer 112 is formed on a substrate 101 and a semiconducting channel layer 110 is formed on the drain layer 112. A source layer 108 is formed on the semiconducting channel layer 110 with at least a portion of the source layer 108 in contact with a contact pad 111. A memory layer 106 is formed on the source layer 108 and in contact with the semiconducting channel layer 110. The dielectric layer 104 is formed on the memory layer 106 and the gate layer 102 is formed on the dielectric layer 104.

Because of their quasi-one-dimensional shape, the nanotubes making up the nanotube source layer 108 provide for a natural gate field enhancement that facilitates charge exchange with the memory layer 106 (when the memory layer 106 includes a charge storage material) at comparatively low gate voltages. Additionally, the majority of charge exchange with the charge storage material is directly from the nanotube source layer 108 rather than being mediated through the semiconducting channel layer 110. This means that the band structure properties of the charge storage material of the memory layer 106 are optimized against the nanotubes independent of the semiconducting material used for the semiconducting channel layer 110. The vertical channel architecture and distinct operational mode of the semiconductor device 100 eliminates the coupling between mobility and the roughness of the dielectric layer. Further, the vertical channel architecture allows a higher packing density of integrated circuit (IC) and/or memory chips in contrast to a lateral channel architecture which has a lower density and/or the additional expense of high resolution patterning.

For the semiconductor device 100 including a charge storage layer in the memory layer 106, both a high mobility of carriers and an efficient (low gate voltage) charge injection into the memory layer 106 may be possible. High mobility enables a reduction in ON-state channel resistance for high speed reading of a memory. Additionally, the ability to inject charges efficiently into a memory layer 106 enables the realization of low write and erase voltages for the memory.

In contrast to a lateral channel, organic TFT, which has a low mobility of carriers in a semiconducting film, the semiconductor device 100 has a higher read speed and lower write and erase voltages. In the ON-state of a lateral channel organic TFT, the charges induced by the gate electric field forming the conducting channel accumulate within the first few nanometers of the interface of the gate dielectric and the semiconducting film in the direction perpendicular with the plane of the interface. If the interface is rough (i.e., on the order of several or tens of nanometer RMS roughness or larger), the carrier mobility in this ultra thin conducting channel is greatly reduced—by orders of magnitude. Given that the available organic materials for OTFTs are already low in mobility, it becomes untenable to further compromise the mobility by roughening the interface with the charge storage layer to reduce write and erase voltages.

It should be noted that ratios, concentrations, amounts, and other numerical data may be expressed herein in a range format. It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1% to about 5%" should be interpreted to include not only the explicitly recited concentration of about 0.1 wt % to about 5 wt %, but also include individual concentrations (e.g., 1%, 2%, 3%, and 4%) and the sub-ranges (e.g., 0.5%, 1.1%, 2.2%, 3.3%, and 4.4%) within the indicated range. The term "about" can include traditional rounding according to significant figures of numerical values. In addition, the phrase "about 'x' to 'y'" includes "about 'x' to about 'y'".

It should be emphasized that the above-described embodiments of the present disclosure are merely possible examples of implementations, merely set forth for a clear understanding of the principles of the disclosure. Many variations and modifications may be made to the above-described embodiment(s) of the disclosure without departing substantially from the spirit and principles of the disclosure. All such modifications and variations are intended to be included herein within the scope of this disclosure.

The invention claimed is:

1. A semiconductor device, comprising:
a gate layer formed on a substrate;
a dielectric layer formed on the gate layer;
a memory layer formed on the dielectric layer;
a source layer formed on the memory layer, where the source layer is electrically percolating and perforated;
a semiconducting channel layer formed on the source layer, where the semiconducting channel layer is in contact with the source layer and the memory layer, and where the source layer and the semiconducting channel layer form a gate voltage tunable charge injection barrier; and
a drain layer formed on the semiconducting channel layer.

2. The semiconductor device of claim 1, wherein the substrate is an insulating substrate.

3. The semiconductor device of claim 2, wherein the insulating substrate includes a conductive substrate with an insulating surface layer.

4. The semiconductor device of claim 1, wherein the gate layer includes an organic conducting or semiconducting material.

5. The semiconductor device of claim 1, wherein the gate layer includes an inorganic conducting or semiconducting material.

6. The semiconductor device of claim 1, wherein the dielectric layer includes an inorganic or organic insulating material.

7. The semiconductor device of claim 1, wherein the memory layer is a charge storage layer.

8. The semiconductor device of claim 7, wherein the charge storage layer is configured such that charge exchange between the source layer and the charge storage layer only occurs upon a gate voltage exceeding a critical threshold gate voltage.

9. The semiconductor device of claim 8, wherein the semiconductor device operates as a hysteresis-free transistor with a programmable threshold voltage.

10. The semiconductor device of claim 1, wherein the memory layer is a ferroelectric layer.

11. The semiconductor device of claim 1, further comprising a floating gate that is fully encased by a dielectric material.

12. The semiconductor device of claim 11, wherein the memory layer includes the floating gate.

13. The semiconductor device of claim 1, wherein the memory layer includes a self-assembled molecular monolayer, a polymer, or a polymer with embedded nanoparticles.

14. The semiconductor device of claim 1, wherein the source layer is a network of carbon nanotubes.

15. The semiconductor device of claim 1, wherein the source layer includes graphene.

16. The semiconductor device of claim 1, wherein the source layer is a network of metallic or semiconducting nanowires.

17. The semiconductor device of claim 1, wherein the source layer includes a layer of a conductor or semiconductor configured to have perforations.

18. The semiconductor device of claim 1, wherein a valence band edge or highest occupied molecular orbital level of the semiconducting channel layer is within a range of about −1.5 eV to about +1.5 eV of a work function of the source layer.

19. The semiconductor device of claim 1, wherein a conduction band edge or lowest unoccupied molecular orbital level of the semiconducting channel layer is within a range of about −1.5 eV to about +1.5 eV of a work function of the source layer.

20. The semiconductor device of claim 1, wherein the semiconducting channel layer includes an organic semiconducting material.

21. The semiconductor device of claim 20, wherein the semiconducting channel layer includes a linearly condensed polycyclic aromatic compound.

22. The semiconductor device of claim 20, wherein the semiconducting channel layer includes a pigment selected from the group consisting of copper-phthalocyanine (CuPc)-based compounds, azo compounds, perylene-based compounds, and derivatives thereof.

23. The semiconductor device of claim 20, wherein the semiconducting channel layer includes a low-molecular compound selected from the group consisting of hydrazone compounds, triphenyl methane-based compounds, diphenylmethane-based compounds, stilbene-based compounds, arylvinyl compounds, pyrazoline-based compounds, triphenyl amine derivatives (TPD), arylamine compounds, low-molecular weight arylamine derivatives (α-NPD), 2,2',7,7'-tetrakis(diphenylamino)-9,9'-spirobifluorene (Spiro-TAD), N,N'-di(1-naphthyl)-N,N'-diphenyl-4,4'-diamonobiphenyl (Spiro-NPB), 4,4',4''-tris[N-3-methylphenyl-N-phenylamino]-triphenylamine (mMTDATA), 2,2',7,7'-tetrakis(2,2-diphenylvinyl)-9,9-spirobifluorene (Spiro-DPVBi), 4,4'-bis(2,2-diphenylvinyl)biphenyl (DPVBi), (8-quininolinolato) aluminum (Alq), tris(8-quinolinolato)aluminum (Alq3), tris(4-methyl-8quinolinolato)aluminum (Almq3), and derivatives thereof.

24. The semiconductor device of claim 20, wherein the semiconducting channel layer includes a polymer compound selected from the group consisting of polythiophene, poly(p-phenylenevinylene) (PPV), polymers containing biphenyl groups, polymers having dialkoxy groups, alkoxyphenyl-PPV, phenyl-PPV, phenyl/dialkoxy-PPV copolymer, poly(2-methoxy-5-(2'-ethylhexyloxy)-1,4-phenylenevinylene) (MEH-PPV), poly(ethylenedioxythiophene) (PEDOT), poly(styrenesulfonic acid) (PSS), poly(aniline) (PAM), poly(N-vinylcarbazole), halogenated poly(N-vinylcarbazole), poly(vinylpyrene), poly(vinylanthracene), pyrene-folmaldehyde resin, ethylcaxbazole-folmaldehyde resin, and modifications thereof.

25. The semiconductor device of claim 20, wherein the semiconducting channel layer includes an n-type transporting organic small molecule, oligomer or polymer selected from the group consisting of 5,5'''-diperfluorohexylcarbonyl-2,2': 5',2'':5'',2'''-quaterthiophene (DFHCO-4T), DFH-4T, DFCO-4T, P(NDI2OD-T2), PDI8-CN2, PDIF-CN2, $F_{16}$CuPc and fullerene, naphthalene, perylene, and oligothiophene derivatives.

26. The semiconductor device of claim 1, wherein the semiconducting channel layer includes an inorganic semiconductor.

27. The semiconductor device of claim 1, wherein the drain layer includes at least one carbon nanotube.

28. The semiconductor device of claim 1, wherein the drain layer includes a contiguous semiconducting or metallic film.

29. The semiconductor device of claim 1, wherein the drain layer includes a contiguous transparent conducting oxide.

30. The semiconductor device of claim 1, wherein the drain layer includes a plurality of semiconducting nanowires.

31. The semiconductor device of claim 1, wherein the source layer is one or more nanotubes or nanowires each of which is directly contacted by a conducting or semiconducting contact.

32. The semiconductor device of claim 1, wherein the substrate, gate layer, dielectric layer, memory layer, source layer, semiconducting channel layer, and drain layer are all optically transparent.

33. The semiconductor device of claim 1, wherein the substrate, gate layer, dielectric layer, memory layer, source layer, semiconducting channel layer, and drain layer are all flexible.

34. A semiconductor device, comprising:
a drain layer formed on a substrate;
a semiconducting channel layer formed on the drain layer;
a source layer formed on and in contact with the semiconducting channel layer, where the source layer is electrically percolating and perforated;
a memory layer formed on the source layer, where the semiconducting channel layer is in contact with the source layer and the memory layer, and where the source layer and the semiconducting channel layer form a gate voltage tunable charge injection barrier;
a dielectric layer formed on the memory layer; and
a gate layer formed on the dielectric layer.

35. The semiconductor device of claim 34, wherein the substrate is an insulating substrate.

36. The semiconductor device of claim 35, wherein the insulating substrate includes a conductive substrate with an insulating surface layer.

37. The semiconductor device of claim 34, wherein the gate layer includes an organic conducting or semiconducting material.

38. The semiconductor device of claim 34, wherein the gate layer includes an inorganic conducting or semiconducting material.

39. The semiconductor device of claim 34, wherein the dielectric layer includes an inorganic or organic insulating material.

40. The semiconductor device of claim 34, wherein the memory layer is a charge storage layer.

41. The semiconductor device of claim 40, wherein the charge storage layer is configured such that charge exchange between the source layer and the charge storage layer only occurs upon a gate voltage exceeding a critical threshold gate voltage.

42. The semiconductor device of claim 41, wherein the semiconductor device operates as a hysteresis-free transistor with a programmable threshold voltage.

43. The semiconductor device of claim 34, wherein the memory layer is a ferroelectric layer.

44. The semiconductor device of claim 34, further comprising a floating gate that is fully encased by a dielectric material.

45. The semiconductor device of claim 44, wherein the memory layer includes the floating gate.

46. The semiconductor device of claim 34, wherein the memory layer includes a self-assembled molecular monolayer, a polymer, or a polymer with embedded nanoparticles.

47. The semiconductor device of claim 34, wherein the source layer is a network of carbon nanotubes.

48. The semiconductor device of claim 34, wherein the source layer includes graphene.

49. The semiconductor device of claim 34, wherein the source layer is a network of metallic or semiconducting nanowires.

50. The semiconductor device of claim 34, wherein the source layer includes a layer of a conductor or semiconductor configured to have perforations.

51. The semiconductor device of claim 34, wherein a valence band edge or highest occupied molecular orbital level of the semiconducting channel layer is within a range of about −1.5 eV to about +1.5 eV of a work function of the source layer.

52. The semiconductor device of claim 34, wherein a conduction band edge or lowest unoccupied molecular orbital level of the semiconducting channel layer is within a range of about −1.5 eV to about +1.5 eV of a work function of the source layer.

53. The semiconductor device of claim 34, wherein the semiconducting channel layer includes an organic semiconducting material.

54. The semiconductor device of claim 53, wherein the semiconducting channel layer includes a linearly condensed polycyclic aromatic compound.

55. The semiconductor device of claim 53, wherein the semiconducting channel layer includes a pigment selected from the group consisting of copper-phthalocyanine (CuPc)-based compounds, azo compounds, perylene-based compounds, and derivatives thereof.

56. The semiconductor device of claim 53, wherein the semiconducting channel layer includes a low-molecular compound selected from the group consisting of hydrazone compounds, triphenyl methane-based compounds, diphenylmethane-based compounds, stilbene-based compounds, arylvinyl compounds, pyrazoline-based compounds, triphenyl amine derivatives (TPD), arylamine compounds, low-molecular weight arylamine derivatives (α-NPD), 2,2',7,7'-tetrakis(diphenylamino)-9,9'-spirobifluorene (Spiro-TAD), N,N'-di(1-naphthyl)-N,N'-diphenyl-4,4'-diamonobiphenyl (Spiro-NPB), 4,4',4''-tris[N-3-methylphenyl-N-phenylamino]-triphenylamine (mMTDATA), 2,2',7,7'-tetrakis(2,2-diphenylvinyl)-9,9-spirobifluorene (Spiro-DPVBi), 4,4'-bis(2,2-diphenylvinyl)biphenyl (DPVBi), (8-quininolinolato)aluminum (Alq), tris(8-quinolinolato)aluminum (Alq3), tris(4-methyl-8quinolinolato)aluminum (Almq3), and derivatives thereof.

57. The semiconductor device of claim 53, wherein the semiconducting channel layer includes a polymer compound selected from the group consisting of polythiophene, poly(p-phenylenevinylene) (PPV), polymers containing biphenyl groups, polymers having dialkoxy groups, alkoxyphenyl-PPV, phenyl-PPV, phenyl/dialkoxy-PPV copolymer, poly(2-methoxy-5-(2'-ethylhexyloxy)-1,4-phenylenevinylene) (MEH-PPV), poly(ethylenedioxythiophene) (PEDOT), poly(styrenesulfonic acid) (PSS), poly(aniline) (PAM), poly(N-vinylcarbazole), halogenated poly(N-vinylcarbazole), poly(vinylpyrene), poly(vinylanthracene), pyrene-folmaldehyde resin, ethylcaxbazole-folmaldehyde resin, and modifications thereof.

58. The semiconductor device of claim 53, wherein the semiconducting channel layer includes an n-type transporting organic small molecule, oligomer or polymer selected from the group consisting of 5,5'''-diperfluorohexylcarbonyl-2,2'':5',2'':5'',2'''-quaterthiophene (DFHCO-4T), DFH-4T, DFCO-4T, P(NDI2OD-T2), PDI8-CN2, PDIF-CN2, $F_{16}$CuPc and fullerene, naphthalene, perylene, and oligothiophene derivatives.

59. The semiconductor device of claim 34, wherein the semiconducting channel layer includes an inorganic semiconductor.

60. The semiconductor device of claim 34, wherein the drain layer includes at least one carbon nanotube.

61. The semiconductor device of claim 34, wherein the drain layer includes a contiguous semiconducting or metallic film.

62. The semiconductor device of claim 34, wherein the drain layer includes a contiguous transparent conducting oxide.

63. The semiconductor device of claim 34, wherein the drain layer includes a plurality of semiconducting nanowires.

64. The semiconductor device of claim 34, wherein the source layer is one or more nanotubes or nanowires each of which is directly contacted by a conducting or semiconducting contact.

65. The semiconductor device of claim 34, wherein the substrate, gate layer, dielectric layer, memory layer, source layer, semiconducting channel layer, and drain layer are all optically transparent.

66. The semiconductor device of claim 34, wherein the substrate, gate layer, dielectric layer, memory layer, source layer, semiconducting channel layer, and drain layer are all flexible.

67. A method, comprising:
forming a gate layer on a substrate;
forming a dielectric layer on the gate layer;
forming a memory layer on the dielectric layer;
forming a source layer on the memory layer, where the source layer is electrically percolating and perforated;
forming a semiconducting channel layer on the source layer and at least a portion of the memory layer; and
forming a drain layer on the semiconducting channel layer.

68. The method of claim 67, further comprising forming a floating gate that is fully encased by a dielectric material.

69. The method of claim 68, wherein the floating gate is formed in the memory layer.

70. The method of claim 67, wherein the source layer is a network of carbon nanotubes.

71. The method of claim 67, wherein the source layer includes graphene.

72. The method of claim 67, wherein the source layer is a network of semiconducting nanowires.

73. The method of claim 67, wherein the drain layer is a network of carbon nanotubes.

74. A method, comprising:
forming a drain layer on a substrate;
forming a semiconducting channel layer on the drain layer;
forming a source layer on the semiconducting channel layer, where the source layer is electrically percolating and perforated;
forming a memory layer formed on the source layer and at least a portion of the semiconducting channel layer;
forming a dielectric layer on the memory layer; and
forming a gate layer on the dielectric layer.

75. The method of claim 74, further comprising forming a floating gate that is fully encased by a dielectric material.

76. The method of claim 75, wherein the floating gate is formed in the memory layer.

77. The method of claim 74, wherein the source layer is a network of carbon nanotubes.

78. The method of claim 74, wherein the source layer includes graphene.

79. The method of claim 74, wherein the source layer is a network of semiconducting nanowires.

80. The method of claim 74, wherein the drain layer is a network of carbon nanotubes.

* * * * *